(12) United States Patent
Oh et al.

(10) Patent No.: US 7,333,036 B2
(45) Date of Patent: Feb. 19, 2008

(54) COMPUTING CIRCUITS AND METHOD FOR RUNNING AN MPEG-2 AAC OR MPEG-4 AAC AUDIO DECODING ALGORITHM ON PROGRAMMABLE PROCESSORS

(75) Inventors: Jong Hoon Oh, Seoul (KR); Myung Hoon Sunwoo, Suwon-si (KR); Jong Ha Moon, Suwon-si (KR)

(73) Assignees: Pulsus Technologies, seoul (KR); Ajou University Industry-Academic Cooperation Foundation, Suwon-Si, Gyeonggi-Do (KR)

( * ) Notice: Subject to any disclaimer, the term of this patent is extended or adjusted under 35 U.S.C. 154(b) by 55 days.

(21) Appl. No.: 11/342,764

(22) Filed: Jan. 30, 2006

(65) Prior Publication Data

US 2007/0024472 A1 Feb. 1, 2007

(30) Foreign Application Priority Data

Aug. 1, 2005 (KR) ...................... 10-2005-0070371

(51) Int. Cl.
H03M 7/40 (2006.01)

(52) U.S. Cl. .......................................... 341/67; 341/50

(58) Field of Classification Search ............. 341/50–90
See application file for complete search history.

(56) References Cited

U.S. PATENT DOCUMENTS

| 6,404,814 | B1 * | 6/2002 | Apostolopoulos et al. | ........ 375/240.12 |
| 6,445,828 | B1 * | 9/2002 | Yim | .......................... 382/250 |
| 6,452,969 | B1 * | 9/2002 | Yim | ...................... 375/240.02 |
| 6,865,668 | B1 * | 3/2005 | Benes et al. | ................... 341/65 |
| 2006/0158568 | A1 * | 7/2006 | Kaylani et al. | ............. 348/725 |

* cited by examiner

*Primary Examiner*—Lam T. Mai
(74) *Attorney, Agent, or Firm*—Volpe And Koenig P.C.

(57) ABSTRACT

The present invention relates to the computing method and Huffman computing circuits for improving the correctness and efficiency of the nonlinear inverse quantization when the MPEG-2 AAC (Advanced Audio Coding) or MPEG-4 AAC algorithm which is used as an audio compression algorithm in multi-channel high-quality audio systems is implemented on programmable processors. In accordance with the present invention, while the architecture of the existing digital signal processor is reused, the performance can be improved by means of the addition of Huffman decoder and bit processing architecture. Accordingly, to design and change the programmable processor can be facilitated.

7 Claims, 14 Drawing Sheets

(5 of 14 Drawing Sheet(s) Filed in Color)

COMPUTING CIRCUITS AND METHOD FOR RUNNING AN MPEG-2 AAC OR MPEG-4 AAC AUDIO DECODING ALGORITHM ON PROGRAMMABLE PROCESSORS

FIELD OF THE INVENTION

The present invention relates to computing circuits and method for running nonlinear inverse quantization of decoding operations in an MPEG-2 AAC or MPEG-4 AAC algorithm correctly and efficiently, which is used as an audio compression algorithm in multi-channel high-quality audio systems, on programmable processors such as Digital Signal Processors, microprocessors, and so on.

BACKGROUND OF THE INVENTION

As the demand for multi-channel high-quality audio has been increased recently, the interest in digital multi-channel audio compression algorithm has been also increased. In order to research compression technologies for digital audio and video, ISO/IEC (International Standards Organization/ International Electrotechnical Commission) founded ISO/MPEG (Moving Pictures Expert Group) in 1988. In 1994, ISO/MPEG started a standardization work for a new compression method available in application fields, in which compatibility with MPEG-1 stereo format was dispensable, and in the process of the work, the standard was designated MPEG-2 NBC (Non-Backward Compatible). Before starting the standardization work, ISO/MPEG had taken a comparative tests of MPEG-2 BC (Backward Compatible) compatible with MPEG-1, with Dolby's AC-3 and AT&T's MPAC, then they reached the conclusion that removing the backward compatibility resulted improvements in the performance of the coder. The goal of MPEG-2 NBC was that the quality of 5-channel full-bandwidth audio signals with a bit rate under 384 kbit/s reached the "aurally indistinguishable" level defined by ITU/R (International Telecommunication Union, Radiocommunication Bureau). Thereafter, MPEG-2 NBC was announced as a new international standard for multi-channel audio coding method in April 1997, and at that time the name was changed to MPEG-2 AAC (Advanced Audio Coding, ISO/IEC 138187). MPEG-2 AAC has been standardized through the above-mentioned process, and is an audio coding method which encodes 5-channel audio signals into high-quality audio data with the bit rate of 320 kbps (64 kbps per one channel).

FIG. 1 is a block diagram that shows an MPEG-2 AAC audio decoding algorithm in the prior art. With reference to FIG. 1, in the MPEG-2 AAC audio algorithm, high-resolution filter bank; prediction coding; sound pressure stereo coding; TNS (Temporal Noise Shaping); and Huffman coding are combined in order to provide an "aurally indistinguishable" sound quality from that of the original sound, with the bit rate under 384 kbit/s. This MPEG-2 AAC audio compression algorithm is a kind of transform coding method using MDCT (Modified Discrete Cosine Transform), and a bit allocation method based on a psychological sound model is used in order to compress the transformed signal.

Further, considering the trade-off among the sound quality, the memory usage, and the power demand, the MPEG-2 AAC audio system supports three types of profile, i.e., the main profile, the LC (Low Complexity) profile, and the SSR (Scalable Sampling Rate) profile are supported.

First, the main profile provides the best sound quality with a given bit rate, and all the tools of AAC are used only except the gain control tool. The main profile is capable of decoding the bit stream of LC profile which may be mentioned later.

Second, the LC profile is the most frequently used profile in general, both the prediction tool and the gain control tool are not used, further the degree of the TNS is limited. The LC profile is characterized by its lower memory usage and power demand than those of the main profile, though its sound quality is relatively acceptable.

And last, the SSR profile consists of the LC profile and the gain control tool. But the prediction tool is not used, moreover the bandwidth as well as the degree of the TNS is limited. The advantage of the SSR profile is that it provides variable frequency signal even though it has lower complexity than that of the main profile or the LC profile.

FIG. 2 provides a graph showing the amount of operations of MPEG-2 AAC LC profile designated by ISO/IEC. As is shown in FIG. 2, Huffman decoding process which is run in the first step of AAC decoding process takes approximately 30% of the amount of total operation in AAC decoding system. Huffman decoding process has to run maximum 289 comparative operations in the worst case according to the characteristic of the input sample, when it is implemented by software on the general programmable processors. In addition, bit line extraction, XOR, OR, and shift operation is needed additionally in order to run the comparative operations above, so a large operation cycle which takes approximately 30% of the amount of total AAC decoding operations is consumed in case that Huffman decoding process is implemented only by software.

The object of Huffman decoding process is to get Huffman index, relating to Huffman code word contained in a bit line, defined in MPEG-2 or MPEG-4 AAC standard documents. Primarily, one of the 12 Huffman tables is selected by using the code book information shown in the additional information of the bit line, and the bit line is compared with the code word on the selected table, then a correspondent index of code is used as a Huffman decoding output relating to one code word.

At present, there are some audio only DSP chips which do not use software method but use Huffman specialized decoder in order to reduce the amount of operations and the complexity in Huffman decoding process. While using software method, Huffman index is located by comparing every one bit of every one codeword. However, the specialized hardware decoder generally has an architecture which outputs Huffman index directly in a short operation cycle by means of a specific hardware storing 12 Huffman tables and all the code words. The Huffman specialized decoder such as the above-mentioned is mainly applied to audio signal processing DSP chips and provides related instructions.

FIG. 3 presents a diagram showing Huffman decoder in the prior art. Huffman index which is the output data of Huffman decoding process is finally stored in an accumulator in DSP chip. In general, most of the specialized hardware Huffman decoders consume 1 or 2 cycles for getting one Huffman index. However, Huffman index should pass the ungrouping process before transformed into a quantized spectrum value, and Huffman index stored in the accumulator should be transferred to a general register in order to run this process. Though, because this process needs XOR operation, OR operation, shift operation, and data transfer instructions, there is a problem that approximately 5 or 6 cycles are consumed before Huffman decoding result is stored in the general register finally. That is, there are unnecessary operation cycles, because normal specialized Huffman decoders do not have an architecture which is directly applied to the ungrouping process, the next step of Huffman decoding process, and reduces the operation cycles.

The sample data quantized after Huffman decoding is transformed into a spectrum data which is an original real number by applying a scale factor. The process above is called dequantization or inverse quantization, and run according to formula 1 and formula 2 below.

$$x\_invquant = Sign(x\_quant) \cdot |x\_quant|^{4/3} \forall k \qquad \text{Formula 1}$$

$$gain = 2^{0.25 \cdot (sf[g][sfb] - SF\_OFFSET)} \qquad \text{Formula 2}$$

In formula 1, x_quant is an ungrouping data of the output of Huffman decoding process, and it is a quantized spectrum data. x_invquant is inverse quantized spectrum data. In formula 2, sf[g] [sfb] is an array comprising the scale factors of each group, and SF_OFFSET is a constant number of 100. The inverse quantization process uses nonlinear quantization method, and decodes the sample values expressed as an integer by the quantization in a coder into an original real number data. That is, a final real number spectrum data necessary for the operation is obtained by multiplying the gain obtained in formula 2 by x_invquant in formula 1.

As is shown in FIG. 2, though the inverse quantization process above does not have a large amount of operations, it is located on the first step of AAC decoding process and generates the real number spectrum data necessary for the operations of decoding steps after this, so correctness of the data is important. If the nonlinear, inverse quantized real number data is not correct, an error occurred at this time becomes an initial accumulation error in MPEG-2 or MPEG-4 AAC decoding process after this, so a correct operation result is needed.

In addition, the inverse quantization process contains a 4/3 power as is shown in formula 1. It is generally impossible to implement a 4/3 power operation on a fixed point DSP, then LUT (Lookup Table) method which calls and uses a value relating to the input from the table made in advance is used primarily. According to the standard of AAC, |x_quant| which is used as an input of the inverse quantization process is defined as having the range below 8191. However, to use a table having 8191 data for the 4/3 power operation has a disadvantage that hardware size of total processor becomes too large. Therefore, a table having 256 or 128 data is implemented in hardware, and computed values by an interpolation method are used for the rest values, in general.

There are many methods for the interpolation above, and the following is an example of them.

Formula 3 shows direct linear interpolation method which uses a table having 256 data, and formula 4 shows a basic characteristic of an interpolation method which generates 8191 data with the table having 256 data.

(1) from $X = 1$ to $256$, \qquad Formula 3

$$X^{\frac{4}{3}} = LUT(X)$$

(2) from $X = 257$ to $2047$, $$X^{\frac{4}{3}} = 2\left(LUT\left(\left\lfloor\frac{X}{8}+1\right\rfloor\right) - LUT\left(\left\lfloor\frac{X}{8}\right\rfloor\right)\right) \times$$

$$rem\left(\frac{X}{8}\right) + LUT\left(\left\lfloor\frac{X}{8}\right\rfloor\right) \times 16$$

(3) from $X = 2048$ to $8191$,

-continued $$X^{\frac{4}{3}} = 4\left(LUT\left(\left\lfloor\frac{X}{64}+1\right\rfloor\right) - LUT\left(\left\lfloor\frac{X}{64}\right\rfloor\right)\right) \times$$

$$rem\left(\frac{X}{64}\right) + LUT\left(\left\lfloor\frac{X}{64}\right\rfloor\right) \times 256$$

$$X^{\frac{4}{3}} = \left(\frac{X}{8} \times 8\right)^{\frac{4}{3}} = \left(\frac{X}{8}\right)^{\frac{4}{3}} \times 16 \qquad \text{Formula 4}$$

In formula 3, LUT(·) function is a function which shows a table value stored in advance, and rem(·) function is a function which outputs a remaining value of a division. As is shown in formula 3, no error occurs when X is from 1 to 256, because the data itself stored in the table is used. However, in case of data from 257 to 8191, there are errors from the real data which are obtained by the 4/3 power of the data from 257 to 8191, because the interpolated results of which data from 1 to 256 are input. As is the result of a simulation, the maximum error of the direct linear interpolation method is 0.04365 in the range from 257 to 2047, and 0.69832 in the range from 2048 to 8191.

(1) from $X = 1$ to $256$, \qquad Formula 5

$$X^{\frac{4}{3}} = LUT(X)$$

(2) from $X = 257$ to $3047$, if $rem(X/8) \leq 4$ $$: X^{\frac{4}{3}} = 2\left(LUT\left(\left\lfloor\frac{X}{8}+1\right\rfloor\right) - LUT\left(\frac{X}{8}\right) - f_a\frac{(x)}{8}\right) \times$$

$$rem\left(\frac{X}{8}\right) + LUT\left(\left\lfloor\frac{X}{8}\right\rfloor\right) \times 16$$

if $rem(X/8) \geq 4$ $$: X^{\frac{4}{3}} = 2\left(LUT\left(\frac{X}{8}+1\right) - LUT\left(\left\lfloor\frac{X}{8}\right\rfloor\right) + f_a\frac{(x)}{8} \times$$

$$\left(4 - rem\left(\frac{X}{8}\right)\right) + LUT\left(\left\lfloor\frac{X}{8}\right\rfloor + 1\right) \times 16$$

(3) from $X = 2048$ to $8191$, if $rem(X/64) \leq 32$ $$: X^{\frac{4}{3}} = 4\left(LUT\left(\frac{X}{64}+1\right) - LUT\left(\left\lfloor\frac{X}{64}\right\rfloor\right)\right) -$$

$$f_b\frac{(X)}{32} \times rem\left(\frac{X}{64}\right) - LUT\left(\left\lfloor\frac{X}{64}\right\rfloor\right) \times 256$$

if $rem(X/64) \geq 32$ $$: X^{\frac{4}{3}} = 4\left(LUT\left(\frac{X}{64}+1\right) - LUT\left(\left\lfloor\frac{X}{64}\right\rfloor\right) +$$

$$f_b\frac{(X)}{32} \times \left(rem\left(\frac{X}{64}\right) - 64\right) +$$

$$LUT\left(\frac{X}{64} - 1\right) \times 256$$

$$f_a(X) = \frac{(2892 - X)}{2^{15}}, \qquad \text{Formula 6}$$

$$f_b(X) = \frac{210 - \left\lfloor\frac{X}{62}\right\rfloor}{128}$$

Formula 5 is an improved algorithm for reducing the error of the interpolated data in the process of the inverse quantization efficiently. The characteristic of the improved algorithm is using the additional functions fa and fb, and these fa and fb functions are shown in formula 6. The maximum error of the improved algorithm using 256 tables is 0.02538 in the range from 257 to 2047, and 0.35389 in the range from 2048 to 8191. However, as is shown in formula 5, the improved algorithm uses the rem(·) function which outputs a remaining as a conditional sentence in order to obtain each sample values. Then, it is a disadvantage that operation cycle becomes longer because the conditional instruction of the processor is used in every operation in order to compute $X^{4/3}$ in the range from 257 to 8191 and accordingly, there is a problem that the amount of operation is increased because the amount of formula to operate is relatively larger than that of the direct linear interpolation method.

At present, as commercial DSP chips for multi-channel high-quality audio processing, there are SHARC DSP's ASDSP-21065L; Cirrus Logic's CS49300 and CS49500; TI's (Texas Instrument) TMSc55x, TMSc64x, and TMSc67x series; LSI Logic's ZSP40x; CLARKSPUR's CD2450 and CD2480; Philips TriMedia's TM-1300 and PNX1500; and Tensilica's Xtensa. Further, ARM's ARM9M and ARM9E are also capable of AAC processing. Most of these commercial DSP chips or processors support the LC profile for multi-channel or stereo channel, moreover TI's TMSc67x, LSI Logic's ZSP series, and SHARC DSP's ASDSP-21065L can support the main profile of AAC.

In general, commercial DSP chips for audio processing assign 24 or 32 bits for data expressions, and they are designed to hold sufficient memory space or to facilitate the I/O with external audio signals so that multi-channel audio processing can be accomplished. Further, in almost every DSP for multi-channel audio system, many hardware resources are run in parallel so as to handle the audio data more than 5.1 channels in real time. For example, SHARC DSP's ASDSP-21065L processor has a Super-Harvard architecture which is capable of running both SIMD (Single Instruction Multiple Data) and SISD (Single Instruction Single Data), then many hardware resources can be run in parallel.

In addition, TMS320c64x, TMS320c67x, TM-1300, and PNX1500 are VLIW (Very Long Instruction Word) processors, and they run quite many hardware resources in parallel by program control using a compiler which is software. In other words, the DSP operation core has Super-Harvard or VLIW architecture in most of the audio only DSP released by commercial DSP chip developing companies, further in many cases, DSP essentially has many ALUs (Arithmetic and Logic Unit) and other hardware resources so that various audio algorithms can be run at high speed. Moreover, in comparison with DSP core, peripheral devices are used more exclusively by audio I/O operations, so in many cases, there exist specialized instructions not for audio signal processing operations but for control of the peripheral devices related to I/O of the audio signals.

However, most of these commercial DSP cores had disadvantages that, their size and the amount of power consumed were relatively large due to their architectural characteristics, and as a result, the efficiency of implementation was lowered when the chips were implemented with SoC (System on a Chip).

SUMMARY OF THE INVENTION

Accordingly, the present invention has been made to solve the above-mentioned problems occurring in the prior art, and an object of the present invention is to provide computing circuits and method for running an MPEG-2 ACC or MPEG-4 ACC algorithm on programmable processors in multi-channel high-quality audio systems, which is appropriate to process high-quality audio signals at high-speed and performs audio decoding operations efficiently with a small chip size and small amount of power consumed. The object of the computing circuits and method described below is to support Huffman decoding and efficient inverse quantization operation on programmable processors based on MPEG-2 or MPEG-4 AAC algorithm.

The MPEG-2 or MPEG-4 AAC decoding computing circuits on programmable processors in accordance with the present invention for attaining the object above-mentioned, in order to run efficient Huffman decoding computing method on programmable processors, comprise a Huffman decoder which is inputted Huffman code word and outputs Huffman index in Huffman decoding operation; and a state register for running MPEG-2 or MPEG-4 AAC decoding operation.

In addition, the MPEG-2 or MPEG-4 AAC decoding computing method on programmable processors in accordance with the present invention, in order to run efficient inverse quantization process on programmable processors, comprises the steps of: using 256 LUTs and applying different formulas to the sample ranges from 1 to 256, from 257 to 2047, and from 2048 to 8191 respectively; comparing the rem function whether it is bigger or smaller than 32 in the sample range from 2048 to 8191 and applying different formulas respectively; using a formula $$\frac{\left(401-\left[\frac{X}{8}\right]\right)}{2^{16}}$$

in order to reduce an error in the sample range from 257 to 2047; and using a formula $$\frac{\left(218-\left[\frac{X}{64}\right]\right)}{2^{12}}$$

in order to reduce an error in the sample range from 2048 to 8191.

BRIEF DESCRIPTION OF THE DRAWINGS

The patent or application file contains at least one drawing executed in color. Copies of this patent or patent application publication with color drawing(s) will be provided by the Office upon request and payment of the necessary fee. Specifically.

Figure 1:
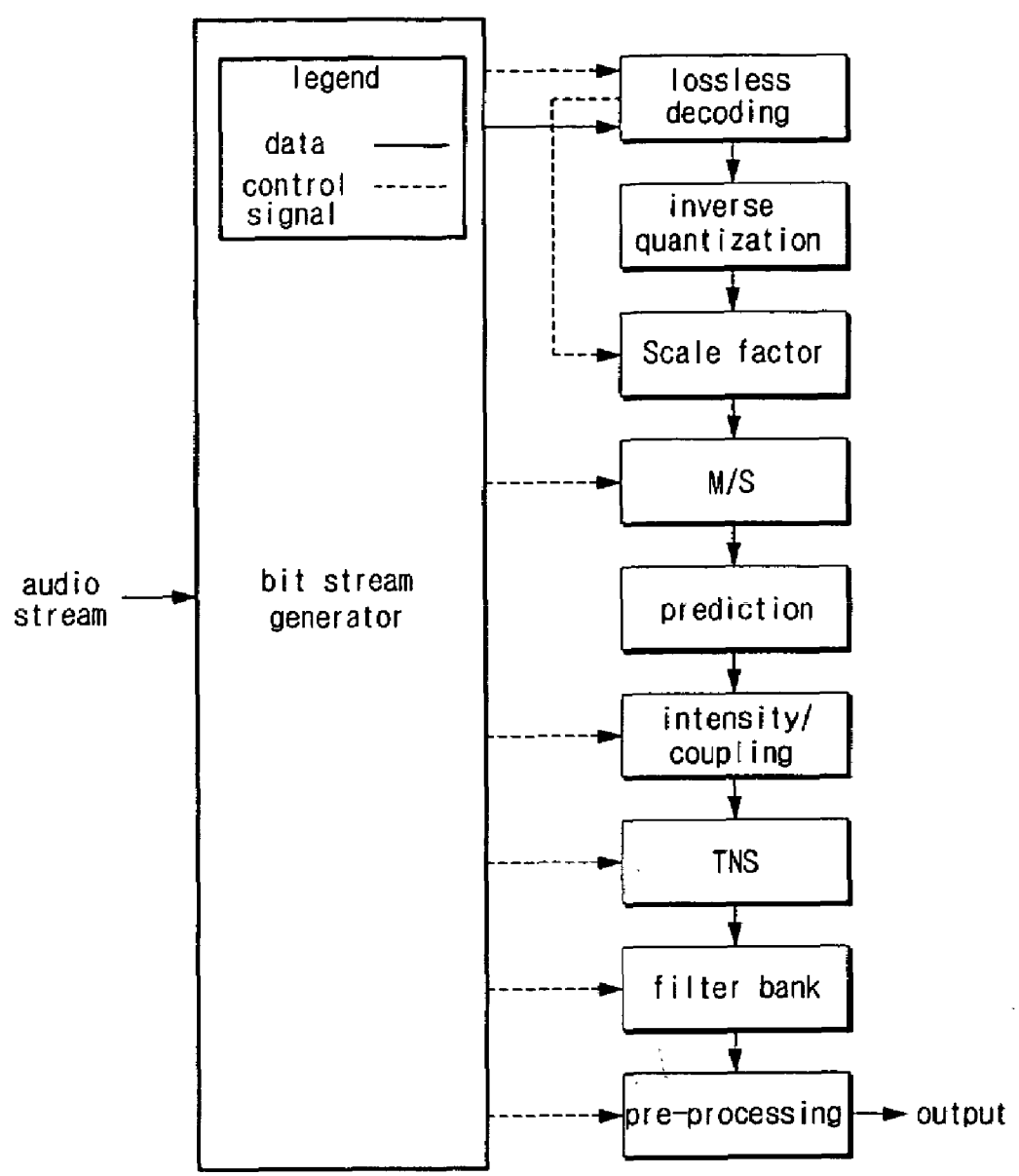
Figure 2:
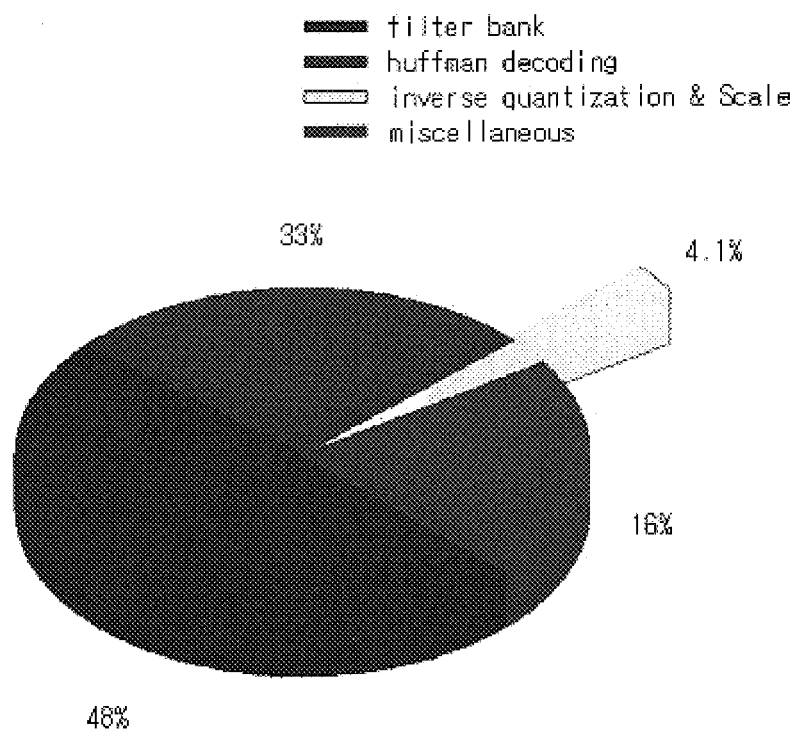
FIGS. 2, 5, 6, 13 and 14 are shown in color.
Figure 3:
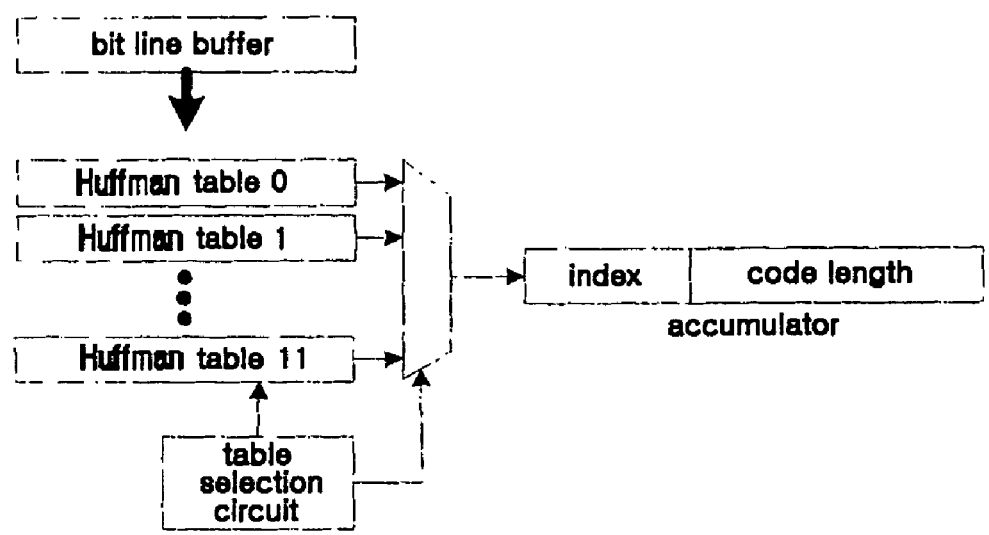
Figure 4:
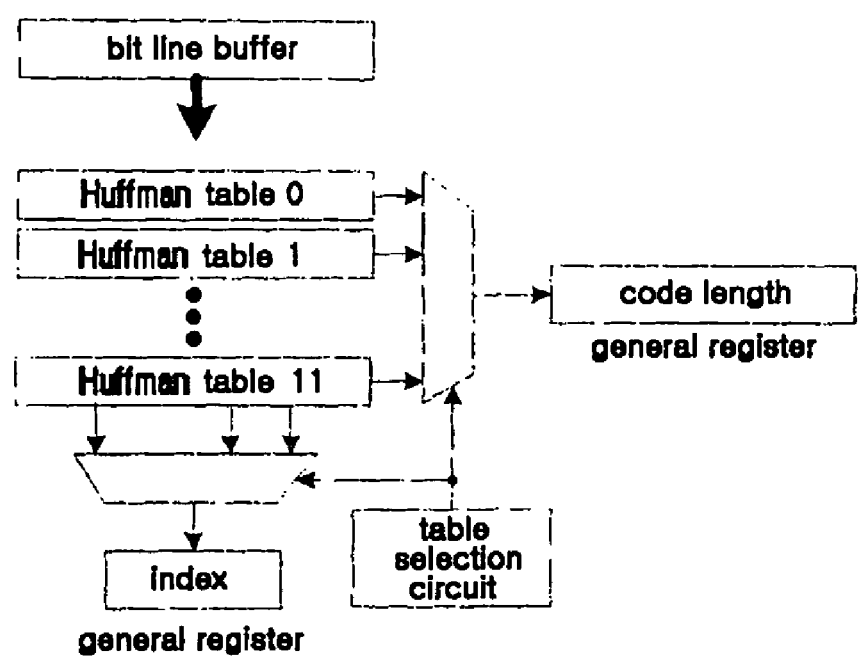
Figure 5:
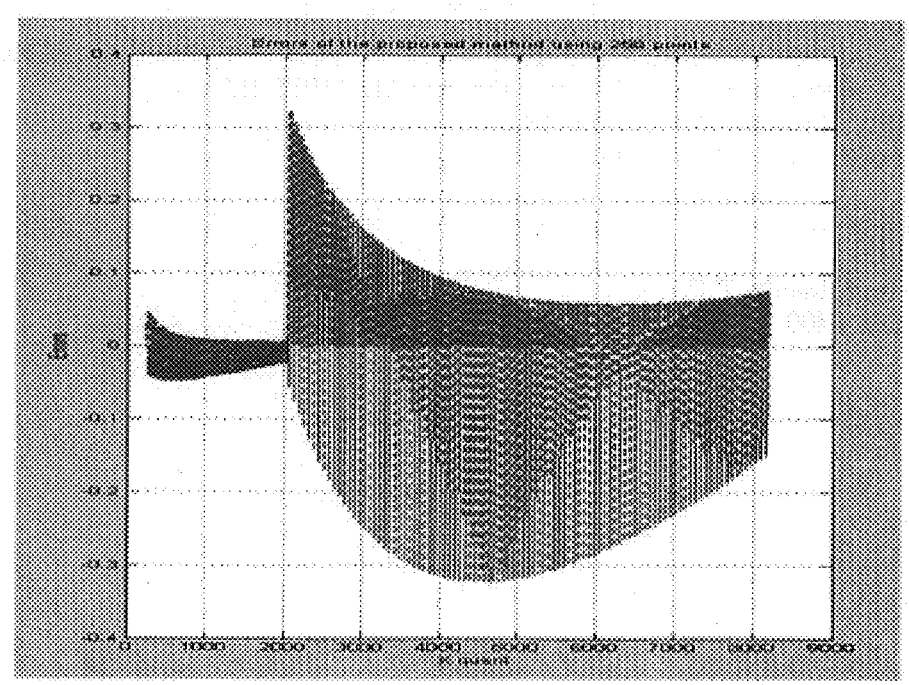
Figure 6:
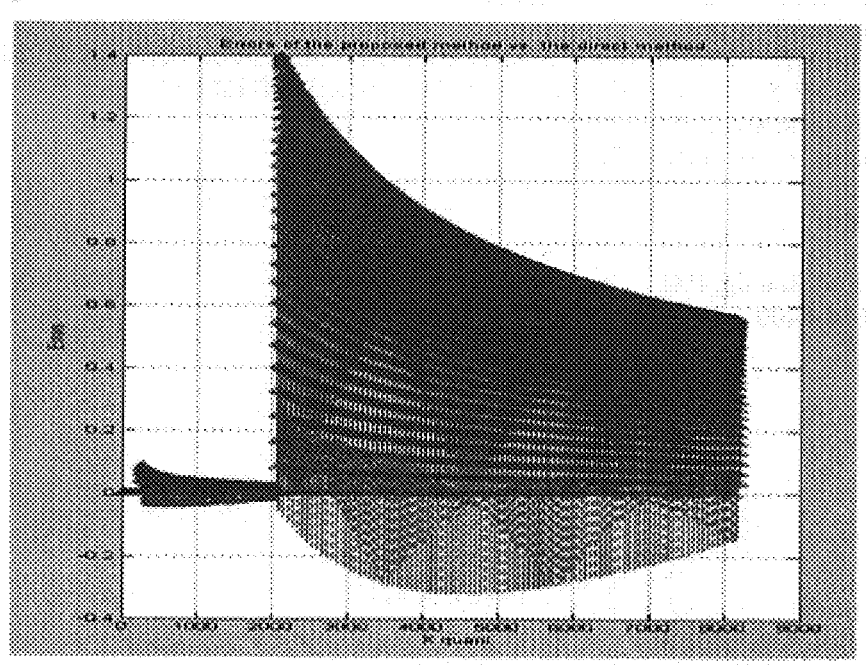
Figure 7:
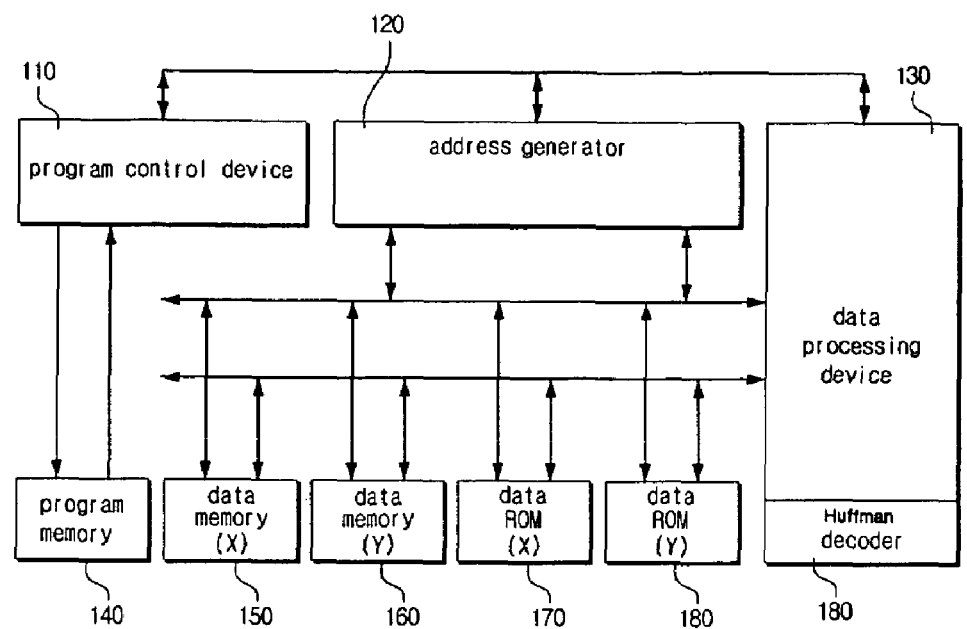
Figure 8:
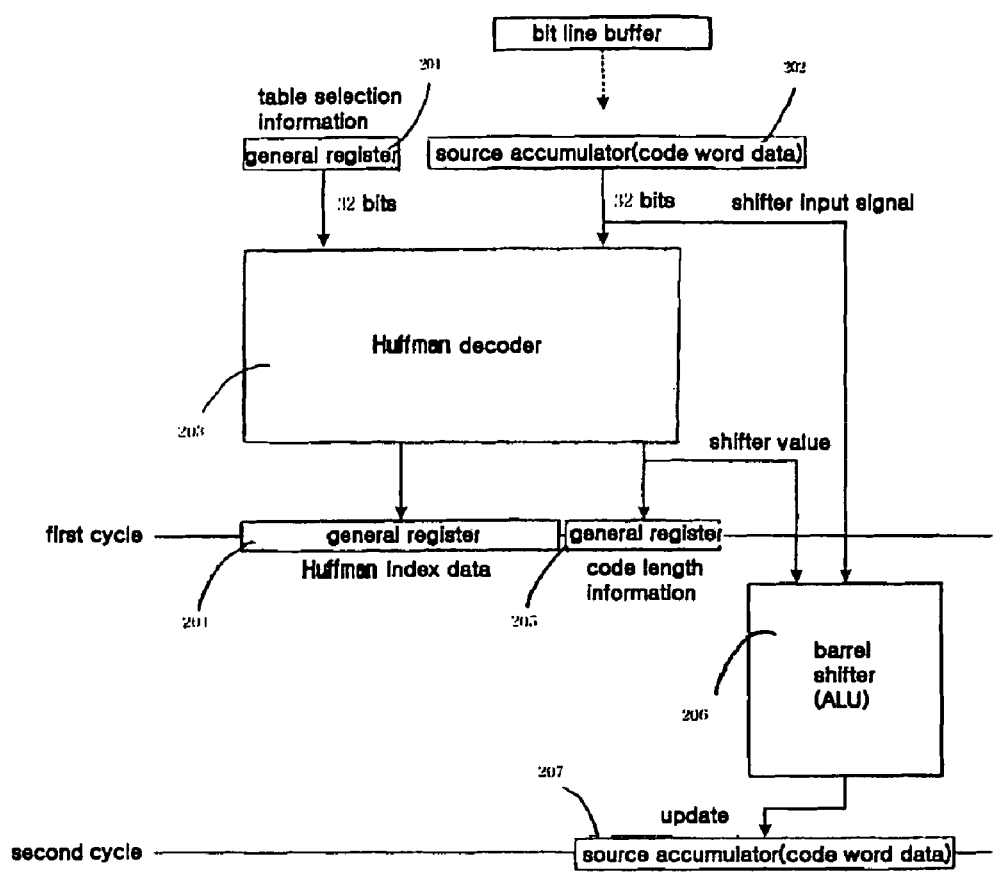
Figure 9:
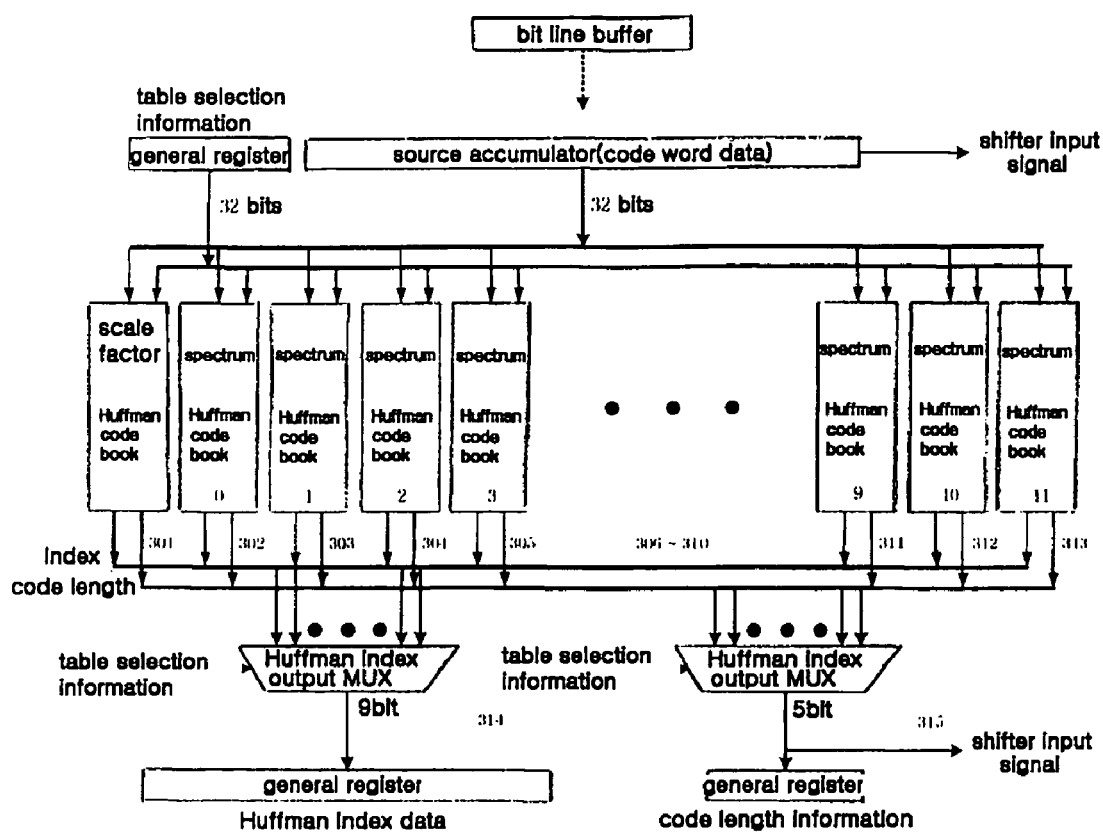
Figure 10:
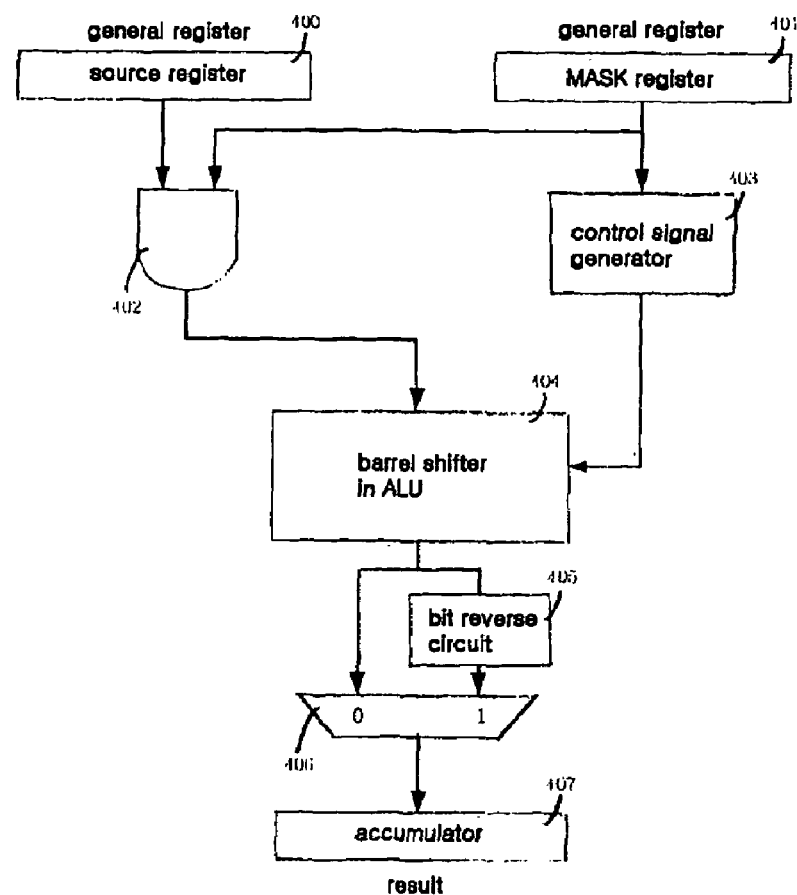
Figure 11:
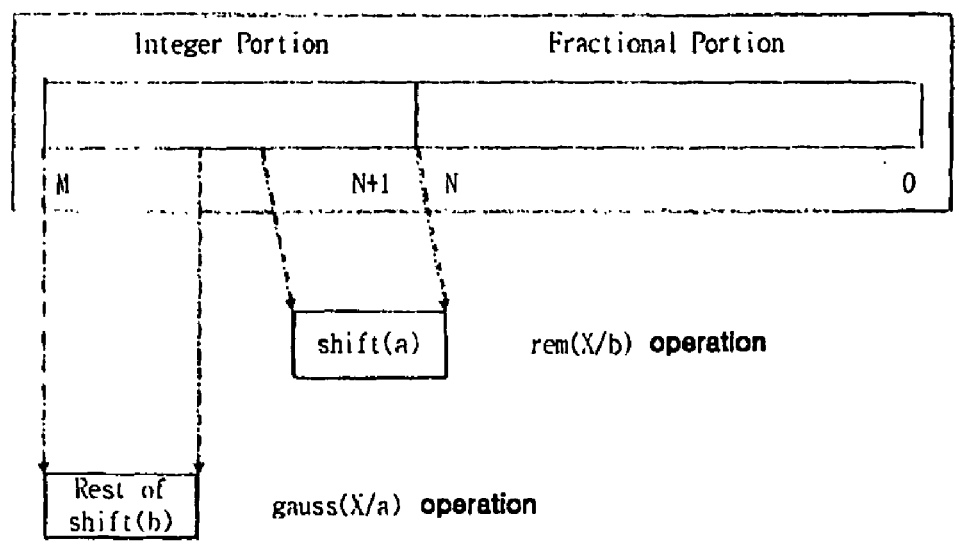
Figure 12:
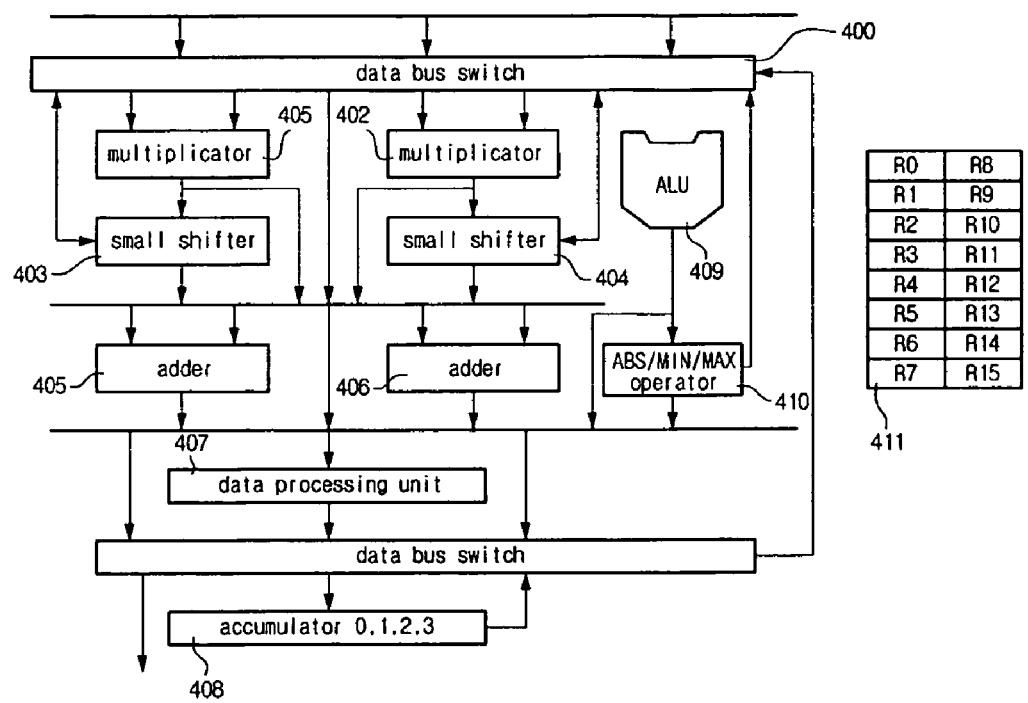
Figure 13:
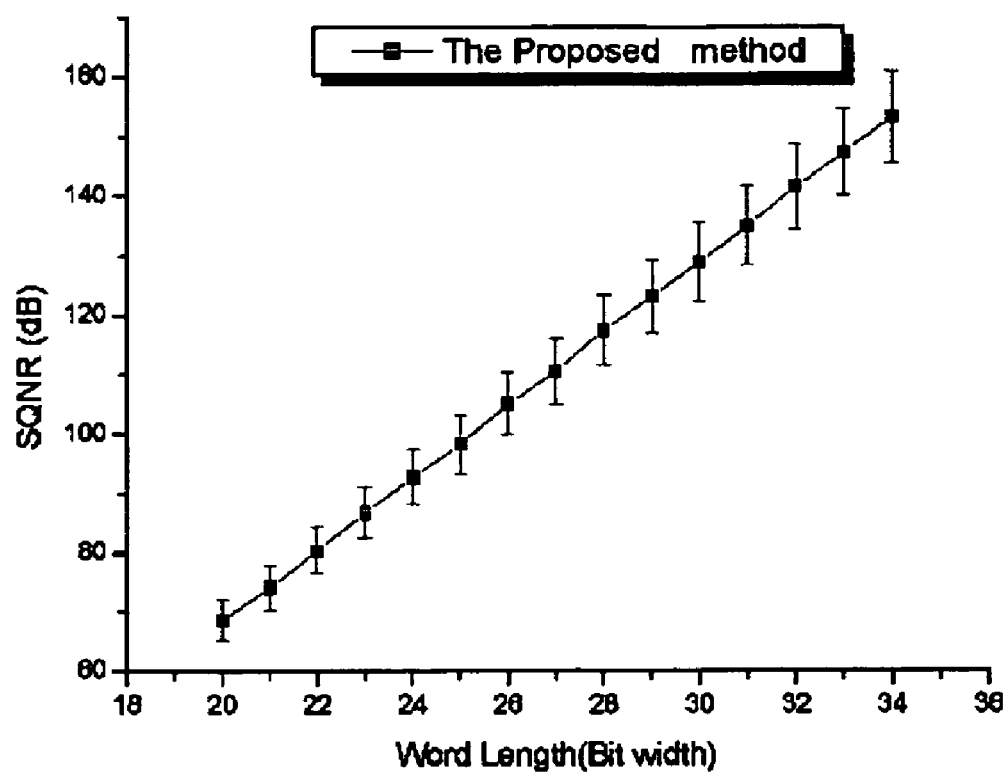
Figure 14:
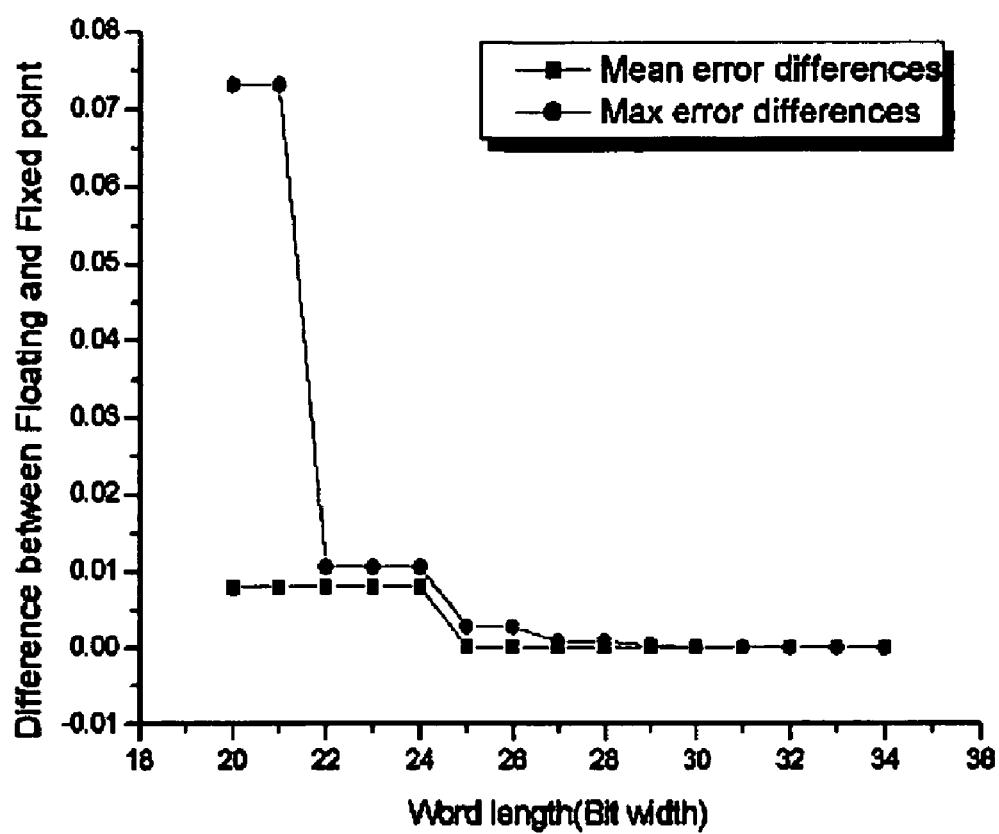

The above and other objects, features and advantages of the present invention will be more apparent from the following detailed description taken in conjunction with the accompanying drawings, in which:

FIG. 1 is a block diagram which shows the process of MPEG-2 AAC audio decoding algorithm in the prior art;

FIG. 2 provides a graph showing the amount of operations of MPEG-2 AAC LC profile designated by ISO/IEC;

FIG. 3 presents a diagram showing Huffman decoder in the prior art;

FIG. 4 presents a diagram showing Huffman decoder in accordance with the present invention;

FIG. 5 is a graph which shows errors occurred when an inverse quantization algorithm is implemented by a direct linear interpolation method in a sample range from 1 to 8191;

FIG. 6 is a graph which shows errors of the inverse quantization algorithm in accordance with the present invention and the direct linear interpolation method at the same time;

FIG. 7 provides a diagram showing a programmable processor in accordance with the present invention;

FIG. 8 is a block diagram showing Huffman decoding process in accordance with the present invention;

FIG. 9 is a diagram showing Huffman decoder in accordance with the present invention;

FIG. 10 presents a diagram showing the architecture for a bit extraction in ALU in accordance with the present invention;

FIG. 11 provides a diagram showing the method of computing Gauss function and rem function in the bit extraction method in accordance with the present invention;

FIG. 12 provides a diagram showing the architecture of the data processing device in accordance with the present invention;

FIG. 13 is a graph showing SQNR simulation result of the inverse quantization algorithm in accordance with the present invention; and FIG. 14 is a graph showing the error differences of the inverse quantization algorithm in accordance with the present invention.

DETAILED DESCRIPTION OF THE PREFERRED EMBODIMENTS

Hereinafter, a preferred embodiment of the present invention will be described with reference to the accompanying drawings.

FIG. 4 presents a diagram showing Huffman decoder in accordance with the present invention. Referring to this, it is the architecture of Huffman specialized decoder, in which no additional operations such as XOR operation, OR operation, shift operation, and data transfer operation is needed in Huffman decoding process. The improved Huffman decoder has an architecture by which the ungrouping decoding process can be run in the next operation cycle without any special operation on the output index. When the architecture shown in FIG. 4 is used, for all audio signals, integer data, which is generated by decoding one Huffman code word and quantizing it in the coder, is outputted to the general register in one cycle so that it can be used as operation source in the next step.

FIG. 5 is a graph which shows errors occurred when an inverse quantization algorithm is implemented by a direct linear interpolation method in a sample range from 1 to 8191. Though the inverse quantization process does not take large part in the amount of total AAC decoding operations, the result becomes an initial error during the decoding process after this when it is not correct, and the error can be continuously larger because of the accumulations. So, correct operation value is necessary in order to assure high-quality sound. The proposed interpolation algorithm can reduce the errors in comparison with other algorithms.

FIG. 6 is a graph which shows errors of the inverse quantization algorithm in accordance with the present invention and the direct linear interpolation method at the same time. As is shown in FIG. 6, when the proposed interpolation algorithm is used, total 8191 data can be outputted with very small errors by using only 256 tables, so that the accumulation errors occurred in the decoding process can be minimized. The improved algorithm can be implemented considering the amount of operation of DSP chip with addition and shift operations, not using multiplication or division. In addition, it uses fewer conditional sentences than the algorithm shown in formula 5 above, the amount of operation by the program control is more decreased. Moreover, as is shown in FIG. 6, the error is alternately positive and negative for each sample, so that the accumulation error can be decreased during the decoding process.

FIG. 7 provides a diagram showing a programmable processor in accordance with the present invention. It comprises: a program control device (110) which generates an operation start signal of MPEG-2 or MPEG-4 AAC algorithm and controls the programmable processor; a program memory (140) storing application programs of the programmable processor; an address generator (120) which calculates the address of the data memory; data memories (150, 160) storing data; data ROMs (170, 180) storing data; a data processing device (130) which run arithmetic and logic operation by using the data in the data memories (150, 160) and in the data ROMs (170, 180) above; and a Huffman decoder (190) for computing Huffman decoding process only. Herein, the data processing device (130) above comprises: two multiplication accumulators which run data multiplication and accumulate it and one ALU; an input register storing the value of the data memory; and an accumulator for storing the operation results and reusing it to the operation.

The instructions in accordance with the present invention are HFMD (Huffman Decoding) which runs Huffman decoding process by operating the AAC Huffman decoder and EXTB (Extract Bit) which handles the Gauss function and the function for obtaining the remaining of division operations in the inverse quantization process efficiently. If the instructions above is used, operations of the programmable processor for decoding the MPEG-2 or MPEG-4 AAC algorithm can be run more efficiently by improving disadvantages of the existing programmable processors, and relatively the smaller hardware size than commercial DSPs can be supported.

The program control device (110) above controls the program as is in the existing programmable processors, and also, it decodes the HFDM instruction, notifies the start of Huffman decoding operation to Huffman decoder (190), and transfers Huffman code book selection signal to Huffman decoder (190) above.

FIG. 8 is a block diagram showing Huffman decoding process in accordance with the present invention. The internal components of FIG. 8 are: a source accumulator (202) storing Huffman code word which is input data; Huffman table selection information (201) storing the additional information data of the MPEG-2 or MPEG-4 AAC bit line; Huffman decoder (203); target accumulator (204) outputting Huffman index data which is output data of Huffman decoding process; a general register (205) outputting the length information of the used code word; a barrel shifter (206) in ALU for updating the data in the source accumulator which is used as an input of the barrel shifter with right-shifted data as much as the code length; and connection lines.

FIG. 9 is a diagram showing Huffman decoder in accordance with the present invention, and it describes the components of Huffman decoder (203) in FIG. 8. The Huffman decoder comprises: a code book (301) used in Huffman decoding of the scale factor; 12 code books (302, 303, 304, 305, 306, 307, 308, 309, 310, 311, 312, 313) used in Huffman decoding of the spectrum data; Huffman index output multiplexer (314) selecting Huffman index according to the table information; a multiplexer (315) outputting the length of the used Huffman code word; and connection lines.

The method for running the decoding in the Huffman decoder above comprises the steps of: inputting the data in the general register which contains the table selection information and in the source accumulator which contains Huffman code word data to Huffman decoder after the HFMD instruction decoding in the program control device; at the same time, inputting the word data in the source accumulator to the barrel shifter in ALU; searching Huffman index by using the selected table in Huffman decoder; at the same time, outputting the length of the used code word; and right-shifting the data of the accumulator in the barrel shifter as much as the outputted code length.

Because 12 Huffman tables in Huffman decoder are implemented with logic circuits, computing speed is higher than in case of using ROM table. In the tables, code words are arranged in the order of short code length, not in the order shown in the standard documents of the MPEG-2 or MPEG-4 AAC. In case that the Huffman decoder above is used, Huffman index and Huffman code length which are the output data, are not outputted to the accumulator but outputted to the general registers respectively. Therefore, they can be used as inputs of the next operation without any additional operation cycles. Moreover, there is an advantage that no additional operations on the accumulator are needed when a new code word is filled in the bit line buffer, because the code word of source accumulator which is used as the input source is right-shifted in the barrel shifter in the ALU as much as the length of Huffman code outputted from Huffman decoder.

Formula 7 below is improving the inverse quantization process used in the MPEG-2 or MPEG-4 AAC decoding algorithm in accordance with the present invention in respect of the amount of operation and the correctness.

(1) from $X = 1$ to 256, Formula 7

$$X^{\frac{4}{3}} = LUT(X)|$$

(2) from $X = 257$ to 2047, $$: X^{\frac{4}{3}} = 2\left(LUT\left(\left[\frac{X}{8}+1\right]\right) - LUT\left(\left[\frac{X}{8}\right]\right)\right) -$$

$$\frac{\left(401 - \left[\frac{X}{8}\right]\right)}{2^{16}} \times \text{rem}\left(\frac{X}{8}\right) +$$

$$LUT\left(\left[\frac{X}{8}\right]\right) \times 2^4$$

(3) from $X = 2048$ to 8191, if $\text{rem}(X/64) \leq 32$ $$: X^{\frac{4}{3}} = 4\left(LUT\left(\left[\frac{X}{64}+1\right]\right) - LUT\left(\left[\frac{X}{64}\right]\right)\right) -$$

$$\frac{\left(218 - \left[\frac{X}{64}\right]\right)}{2^{12}} \times \text{rem}\left(\frac{X}{64}\right) -$$

$$LUT\left(\left[\frac{X}{64}\right]\right) \times 2^8 \text{ if } \text{rem}(X/64) \geq 32$$

$$: X^{\frac{4}{3}} = 4\left(LUT\left(\left[\frac{X}{64}+1\right]\right) - LUT\left(\left[\frac{X}{64}\right]\right)\right) +$$

$$\frac{\left(218 - \left[\frac{X}{64}\right]\right)}{2^{12}} \times \left(\text{rem}\left(\frac{X}{64}\right) - 64\right) +$$

$$LUT\left(\left[\frac{X}{64}\right]+1\right) \times 2^9$$

$$X^{\frac{4}{3}} = \left(\frac{X}{8} \times 8\right)^{\frac{4}{3}} = \left(\frac{X}{8}\right)^{\frac{4}{3}} \times 16 \quad \text{Formula 8}$$

Formula 7 is divided into 3 ranges, which are from 1 to 256, from 257 to 2047 and from 2048 to 8191. The number of used LUT is 256, range from 1 to 256, and the results computed by formula 7 are used for the rest ranges. Each formula is designed to process multiplication and division operations by shift operation in order to reduce the amount of operation of the programmable processor, and it is implemented to process the result of the gauss function which shows the maximum integer and rem function which shows the remaining of a division operation by bit extracting operation through the EXTB instruction. In addition, using the conditional sentences in each range is minimized in order to minimize the program control process in assembly programs, and the differences between the computed data with the proposed algorithm and the true real number data have + and − values alternately so that the accumulated error in the step after the audio decoding process can be decreased.

The method for running the inverse quantization process comprises the steps of: judging the input data X is in the range from 1 to 256, from 257 to 2047, or from 2048 to 8191; judging the result of rem(X/64) is whether bigger or smaller than 32 in case of the range from 2048 to 8191; and computing the result in the judged range according to the assigned formula. In formula 7, it is possible to compute division and multiplication operation of general power of 2 by shift operation, and the gauss function and rem function can be processed by the EXTB instruction.

FIG. 10 presents a diagram showing the architecture for a bit extraction in ALU in accordance with the present invention. The EXTB is an instruction which extracts the value of location set to 1 in the mask register from the source register and stores it to the accumulator. The internal components of FIG. 10 comprises: 2 general registers (400, 401) used as an input data; an AND operator (402) running a logic operation of the source register and the mask register; a control signal generator (403) computing the shift value from the mask value; a barrel shifter (404) in the ALU; a bit reverse circuit (405) which can arrange the result in left or right direction; a multiplexer (406); and an accumulator (407). The control signal generator (403) is implemented with a general LOD (Leading one detector) which outputs the first location of 1 in the LSB, and the bit reverse circuit (405) changes the location of the LSB and the MSB of every bit.

The method for computing the gauss function and the rem function with the EXTB instruction may be described with the reference to the accompanying FIG. 11. First, the method for computing the gauss function comprises the steps of: getting a log 2(a) which represents an exponent of a with the base of 2 in gauss(X/a); and extracting the rest of integer portion excluding the log 2(a) (rest of shift[log 2(a)]). For example, in case of computing gauss(307/64), gauss(307/64)=4 is the wanted output because 307/64=4.796875. 307 is 100110011 in binary number, and log 2(64)=6 because 64=26. By extracting the upper bits excluding the lower 6 bits, binary number 100 can be obtained, accordingly 4 in decimal number is the output data of the gauss function.

In addition, the method for computing the rem(·) function comprises the steps of: getting log 2(b) for b in rem(X/b); and extracting the lower bits as much as the log 2(b) bits in an integer portion. For example, in case of computing rem(28/8), when 28 is divided by 8, the quotient is 3 and the remaining is 4 because 28=(8×3)+4. Therefore 4 is the output of rem(28/8). Because 28 is 11100 in binary number and log 2(8)=8, by extracting lower 3 bits of 28, binary number 100 can be obtained, accordingly 4 in decimal number is the output data of the rem function.

FIG. 12 provides a diagram showing the architecture of the data processing device in accordance with the present invention. Referring to FIG. 12, the data processing device comprises: 2 multiplication accumulators (501, 502, 503, 504, 505, 506) supporting 2 small shift operations; 1 ALU and operators (509, 511) for processing maximum, minimum, and absolute value; a data bus switch (500); 16 input registers (512); a data processing unit (507) for Saturation/Limit/Round; Huffman decoder (510); and 4 accumulators (508). The multiplication accumulator in accordance with the present invention supports a logic network architecture by which the input can be obtained from the bus switch without passing the multiplicator in order to use the accumulator.

The data processing device uses the data read from the memory by storing to 16 input registers, and supports the small shifter which supports the shift operation before and after multiplication and addition in order to process division and multiplication operation efficiently in the inverse quantization process. By using Huffman specialized decoder, Huffman decoding process in the AAC decoding operation can be run efficiently, and total number of data bits can be 24 bits for efficiency in audio algorithm or 32 bits in order to run the post-processing such as an equalizer of digital audio in high-quality.

In accordance with the present invention, as is mentioned in detail, computing circuits and method for running an MPEG-2 or MPEG-4 AAC algorithm efficiently are provided, and Huffman decoding and the inverse quantization process which takes large part of the amount of the operations in implementation of an MPEG-2 or MPEG-4 AAC algorithm can be performed in efficient. In addition, while the architecture of the existing digital signal processor is reused, the performance can be improved by means of the addition of Huffman decoder and bit processing architecture. After all, to design and change the programmable processor can be facilitated.

TABLE 1

| Syntax | Description |
| --- | --- |
| HFMD | hfmd GR0, GR1, Acc0, GR[n] | GR0 ←Huffman index of Acc0 (9 bits) GR1 ←length of code word (5 bits) In the next cycle, Acc0 used as a source will be right-shifted as much as the code word and arranged |
| EXTB | extb Acc1, GR0, GR1, r/1 | Extract the location set to 1 in GR1 and store it in Acc1. The way to be arranged in Acc1 is decided according to the right/left bit |

Table 1 shows the specialized instructions proposed for running the MPEG-2 or MPEG-4 AAC algorithm efficiently and their operations in detail. The proposed programmable processor is designed to support the specialized instructions above.

TABLE 2

| Type of processor | Number of cycles necessary for a sample of Huffman index |
| --- | --- |
| Domestic audio only DSP | 5 |
| Taiwanese audio only VLSI | 2.5 |
| Architecture of the present invention | 2 |

Table 2 provides the performance of Huffman decoder in accordance with the present invention and the existing Huffman decoder, in respect of the operation cycle. Each item represents the number of cycles which is needed between extracting one Huffman index and using it for the next operation process, and the architecture in accordance with the present invention needs 3 cycles and 0.5 cycles fewer than the domestic audio only DSP and Taiwanese audio only VLSI chip respectively. In addition, Huffman decoder in accordance with the present invention outputs Huffman index and Huffman code length which are the output data into each general register, so that no additional operations, such as shift, XOR, and so on, are needed for running the next operation or memory storing process.

TABLE 3

| Type of algorithm | Max error (sample range from 257~2048) | Max error (sample range from 2049~8191) | Average error |
| --- | --- | --- | --- |
| Direct linear interpolation method | 0.08728 | 1.39655 | 0.41979 |
| Domestic audio DSP | 0.04365 | 0.69832 | −0.20990 |
| Taiwanese (256 tables) | 0.02538 | 0.35389 | 0.03161 |
| Taiwanese (128 tables) | 0.03669 | 0.58217 | 0.16233 |
| Method of the present invention | 0.048115 | 0.323076 | 0.007963 |

Table 3 shows the performance of the inverse quantization algorithm in accordance with the present invention and the existing method, in respect of the errors. Though the inverse quantization process does not take large part in the amount of total MPEG-2 or MPEG-4 AAC decoding operations, the result becomes an initial error during the decoding process after this when it is not correct, so a correct operation result is needed. Accordingly, the more excellent performance is shown as the error between $X^{4/3}$ computed by the interpolation method and the real value approaches 0.

The inverse quantization algorithm in accordance with the present invention uses 256 LUTs based on the proposed formula, so that it can be applied to the existing commercial programmable processors by the proposed formula. In case of running the proposed inverse quantization algorithm, the average error of the computed $X^{4/3}$ is decreased approximately 98.1% in comparison with the direct linear interpolation method, and decreased approximately 96.2% in comparison with the proposed algorithm in the domestic audio only DSP. In addition, in case of using 256 and 128 LUTs, the average errors are decreased approximately 74.8% and 95.1% respectively, in comparison with Taiwanese proposed algorithm for audio chip.

The present invention supports specialized bit extraction instruction EXTB for processing the gauss function and the rem function which is difficult to be processed with general fixed point DSP in the inverse quantization process. By using the proposed bit extraction instruction, the process of the gauss function and the rem function can be run in 1 cycle.

FIG. 13 is a graph showing SQNR (Signal to Quantization Noise Ratio) simulation result of the inverse quantization algorithm in accordance with the present invention. The simulation shows every SQNR in case that the number of the data bits of the programmable processor is from 20 to 34 respectively, and it can be known that very excellent correctness over 90 dB is achieved when the number of the data bits is 24.

FIG. 14 is a graph showing the error differences of the inverse quantization algorithm in accordance with the present invention, and it is a simulation result of the differences between the floating and fixed point in respect of the average errors and the maximum errors respectively. The simulation is run on the same word length from 20 bits to 34 bits to each error. The difference between the interpolated value and the real value approaches nearly 0 when the number of the data bits is over 28 bits, and the excellent performance is achieved when the number of the data bits is over 22 bits.

In the instructions, algorithm, and hardware architecture above-mentioned, most of the existing operation modules are reused and only data processing circuit and Huffman decoder are added, so that it is economical in respect of the design price and very efficient in respect of the operation speed to implement the MPEG-2 or MPEG-4 AAC algorithm with the instructions, algorithm, and hardware architecture above-mentioned.

What is claimed is:

1. An MPEG decoding computing circuit on programmable processors comprising:
    a Huffman decoder which accepts as an input Huffman code word and outputs an Huffman index in Huffman decoding operation; and
    a state register for running at least one of MPEG-2 AAC and MPEG-4 AAC decoding operation,
    wherein the Huffman decoder comprises:
        a first general resister which stores table selection information according to a start signal;
        an accumulator register which stores the Huffman code word;
        a Huffman specialized decoder which runs the Huffman decoding operation;
        a second general register which outputs the Huffman index;
        a third general register which outputs length information of the used Huffman code word; and
        a barrel shifter which shifts and updates a source accumulator by using the length information of the used Huffman code word as a shift size.

2. The MPEG decoding computing circuit according to claim 1, further comprising:
    one 2-input AND gate for running a bit extracting operation;
    a connection line which searches a location of 1 and send it to the barrel shifter; and
    a multiplexer which assigns an array location at the time of storing the Huffman code word in the accumulator register.

3. The MPEG decoding computing circuit according to claim 1, further comprising:
    a data bus circuit for providing an input data from a data memory and a read only memory (ROM) and writing an output data to the data memory;
    two multiplication accumulators which runs multiplication operation of data and accumulates it and one ALU;
    an operation circuit comprising ABS/MIN/MAX control circuit and data processing unit;
    a fourth general register which stores a value of the data memory; and
    a data processing device which has a small shifter.

4. The MPEG decoding computing circuit according to claim 1 further comprising: 12 Huffman code books which stores Huffman code word, index, and Huffman code length data in the Huffman specialized decoder;
    a first multiplexer which outputs an Huffman index according to a table with reference to the table selection information of a Huffman code book; and
    a second multiplexer which outputs Huffman code length according to the table with reference to the table selection information of the Huffman code book.

5. An MPEG decoding computing method on programmable processors, comprising the steps of:
    using 256 look-up tables (LUTs) and applying different formulas to sample ranges from 1 to 256, from 257 to 2047, and from 2048 to 8191, respectively;
    comparing a rem function whether it is bigger or smaller than 32 in the sample range from 2048 to 8191 and applying different formulas respectively;
    using a formula $$\frac{\left(401 - \left[\frac{X}{8}\right]\right)}{2^{16}}$$

in order to reduce an error in the sample range from 257 to 2047; and
    using a formula $$\frac{\left(218 - \left[\frac{X}{64}\right]\right)}{2^{12}}$$

in order to reduce an error in the sample range from 2048 to 8191.

6. The MPEG decoding computing method according to claim 5, further comprising the steps of:
    using an extract bit (EXTB) computing instruction in an inverse quantization process of MPEG AAC decoding operation;
    computing a gauss function with the EXTB computing instruction; and
    computing the rem function with the EXTB computing instruction.

7. The MPEG decoding computing method according to claim 5, further comprising the steps of running at least one of the MPEG-2 AAC and MPEG-4 AAC decoding operation with a Huffman decoding computing instruction.

* * * * *